US012772764B2

(12) United States Patent
Wang et al.

(10) Patent No.: US 12,772,764 B2
(45) Date of Patent: Oct. 20, 2026

(54) METHODS OF FORMING CONFORMAL SILICON OXYCARBONITRIDE THIN FILMS ON HIGH ASPECT RATIO SEMICONDUCTOR STRUCTURES

(71) Applicants: Applied Materials, Inc., Santa Clara, CA (US); National University of Singapore, Singapore (SG)

(72) Inventors: Xinke Wang, Singapore (SG); Lakmal C. Kalutarage, San Jose, CA (US); Bhaskar Jyoti Bhuyan, San Jose, CA (US); Mark Saly, Santa Clara, CA (US); John Sudijono, Singapore (SG); SeyedMahmoud Hosseini, Sunnyvale, CA (US); Wei Shi, Singapore (SG); Yuye Kang, Singapore (SG)

(73) Assignees: Applied Materials, Inc., Santa Clara, CA (US); National University of Singapore, Singapore (SG)

( * ) Notice: Subject to any disclaimer, the term of this patent is extended or adjusted under 35 U.S.C. 154(b) by 416 days.

(21) Appl. No.: 18/602,159

(22) Filed: Mar. 12, 2024

(65) Prior Publication Data

US 2025/0293017 A1 Sep. 18, 2025

(51) Int. Cl.

| | |
|---|---|
| ***H10P 14/692*** | (2026.01) |
| ***H10D 64/01*** | (2025.01) |
| ***H10P 14/60*** | (2026.01) |

(52) U.S. Cl.

CPC ....... *H10P 14/6927* (2026.01); *H10D 64/017* (2025.01); *H10P 14/6306* (2026.01); (Continued)

(58) Field of Classification Search

CPC ............. H10P 14/6927; H10P 14/6306; H10P 14/6339; H10P 14/6529; H10P 14/6682; (Continued)

(56) References Cited

U.S. PATENT DOCUMENTS

| | | | | |
|---|---|---|---|---|
| 9,786,491 | B2 * | 10/2017 | Suzuki | H10P 14/6336 |
| 11,289,584 | B2 | 3/2022 | Wu et al. | |

(Continued)

FOREIGN PATENT DOCUMENTS

| | | | |
|---|---|---|---|
| JP | 2014175320 | A | 9/2014 |
| KR | 20190002005 | A | 1/2019 |

OTHER PUBLICATIONS

"PCT International Search Report and Written Opinion in PCT/US2025/018840 dated Jun. 27, 2025, 10 pages".

*Primary Examiner* — John P. Dulka
(74) *Attorney, Agent, or Firm* — Servilla Whitney LLC

(57) ABSTRACT

Methods of depositing high-quality conformal silicon oxycarbonitride (SiOCN) films in the formation of semiconductor devices are described. The methods include a first deposition cycle comprising exposing a semiconductor substrate in a semiconductor processing chamber to a first precursor, a first purge gas, a second precursor, and a second purge gas to deposit a conformal silicon carbonitride (SiCN) film, wherein the first precursor is a silicon- and carbon-containing precursor, and the second precursor comprises one or more of ammonia ($NH_3$), a diamine ($NH_2$—R—$NH_2$ wherein R is an alkyl group), hydrazine ($N_2H_4$), and diazene ($N_2H_2$). The conformal silicon carbonitride (SiCN) film is then oxidized to form a conformal silicon oxycarbonitride (SiOCN) film, and the conformal silicon oxycarbonitride (SiOCN) film is thermally annealed to form a high-quality conformal silicon oxycarbonitride (SiOCN) film.

20 Claims, 5 Drawing Sheets

(52) U.S. Cl.
CPC ...... *H10P 14/6339* (2026.01); *H10P 14/6529* (2026.01); *H10P 14/6682* (2026.01)

(58) Field of Classification Search
CPC ............. H10P 14/6336; H10P 14/6522; H10P 14/6532; H10P 14/662; H10P 14/668; H10P 14/6687; H10P 14/6905; H10P 14/69215; H10P 14/6922; H10D 64/017; H10D 62/121
See application file for complete search history.

(56) References Cited

U.S. PATENT DOCUMENTS

| | | | |
|---|---|---|---|
| 11,393,678 B2 | 7/2022 | Durand et al. | |
| 2016/0002039 A1 | 1/2016 | Thompson et al. | |
| 2016/0322214 A1* | 11/2016 | Li | C23C 16/30 |
| 2020/0152444 A1* | 5/2020 | Sano | C23C 16/36 |
| 2020/0332415 A1 | 10/2020 | Bhuyan et al. | |
| 2022/0384607 A1* | 12/2022 | Yoshida | H10D 30/014 |

* cited by examiner

METHODS OF FORMING CONFORMAL SILICON OXYCARBONITRIDE THIN FILMS ON HIGH ASPECT RATIO SEMICONDUCTOR STRUCTURES

TECHNICAL FIELD

Embodiments of the present disclosure pertain to the field of semiconductor device manufacturing. More particularly, embodiments of the disclosure are directed to methods of depositing silicon oxycarbonitride (SiOCN) layers in the formation of high aspect ratio semiconductor devices.

BACKGROUND

The transistor is a key component of most integrated circuits. Since the drive current, and therefore speed, of a transistor is proportional to the gate width of the transistor, faster transistors generally require larger gate width. Thus, there is a trade-off between transistor size and speed, and “fin” field-effect transistors (FinFETs) have been developed to address the conflicting goals of a transistor having maximum drive current and minimum size. FinFETs are characterized by a fin-shaped channel region that greatly increases the size of the transistor without significantly increasing the footprint of the transistor and are now being applied in many integrated circuits. FinFETs, however, have their own drawbacks.

As the feature sizes of transistor devices continue to shrink to achieve greater circuit density and higher performance, there is a need to improve transistor device structure to improve electrostatic coupling and reduce negative effects such as parasitic capacitance and off-state leakage. Examples of transistor device structures include a planar structure, a fin field effect transistor (FinFET) structure, and a horizontal gate all around (hGAA) structure. The hGAA device structure includes several lattice matched channels suspended in a stacked configuration and connected by source/drain regions. The hGAA structure provides good electrostatic control and can find broad adoption in complementary metal oxide semiconductor (CMOS) wafer manufacturing.

Performance of hGAA and other semiconductor devices having high aspect ratio openings is related to the characteristics of the materials used as well as the thickness and area of the structural layers. As some characteristics are adjusted, however, to accommodate device scaling, challenges arise. With chemical vapor deposition (CVD), plasma enhanced chemical vapor deposition (PECVD), and plasma enhanced atomic layer deposition (PEALD), it is difficult to obtain high-quality (low wet etch rate (WER)) conformal silicon oxycarbonitride (SiOCN) films on high aspect ratio structures, especially on reentrant structures such as GAA.

Accordingly, there is a need in the art for improved methods of depositing high-quality conformal low-K silicon oxycarbonitride (SiOCN) films without damaging the surrounding semiconductor structures.

SUMMARY

One or more embodiments of the disclosure are directed to a method of manufacturing a semiconductor device. The method comprises: a first deposition cycle comprising exposing a semiconductor substrate in a semiconductor processing chamber to a first precursor, a first purge gas, a second precursor, and a second purge gas to deposit a conformal silicon carbonitride (SiCN) film, wherein the first precursor is a silicon- and carbon-containing precursor, and the second precursor comprises one or more of ammonia ($NH_3$), a diamine ($NH_2$—R—$NH_2$ wherein R is an alkyl group), hydrazine ($N_2H_4$), and diazene ($N_2H_2$); oxidizing the conformal silicon carbonitride (SiCN) film to form a conformal silicon oxycarbonitride (SiOCN) film; and thermally annealing the silicon oxycarbonitride (SiOCN) film to form a high-quality conformal silicon oxycarbonitride (SiOCN) film having a wet etch rate less than 10 Å/min in 100:1 dilute hydrofluoric acid (DHF).

Additional embodiments of the disclosure are directed to a method of manufacturing a gate-all-around device, the method comprising: in a first deposition cycle, exposing a substrate comprising a dummy gate structure on a top surface of a superlattice structure in a semiconductor processing chamber to a first precursor comprising a silicon- and carbon-containing precursor, a first purge gas, a second precursor comprising one or more of ammonia ($NH_3$), a diamine ($NH_2$—R—$NH_2$ wherein R is an alkyl group), hydrazine ($N_2H_4$), and diazene ($N_2H_2$), and a second purge gas to deposit a conformal silicon carbonitride (SiCN) film as an inner spacer on the superlattice structure, the superlattice structure including a plurality of semiconductor material layers and a corresponding plurality of release layers alternatingly arranged in a plurality of stacked pairs; oxidizing the conformal silicon carbonitride (SiCN) film to form a silicon oxycarbonitride (SiOCN) film; and thermally annealing the conformal silicon oxycarbonitride (SiOCN) film to form a high-quality conformal silicon oxycarbonitride (SiOCN) film having a wet etch rate less than 10 Å/min in 100:1 dilute hydrofluoric acid (DHF).

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the Figures of the accompanying drawings in which like references indicate similar elements.

Figure 1A:
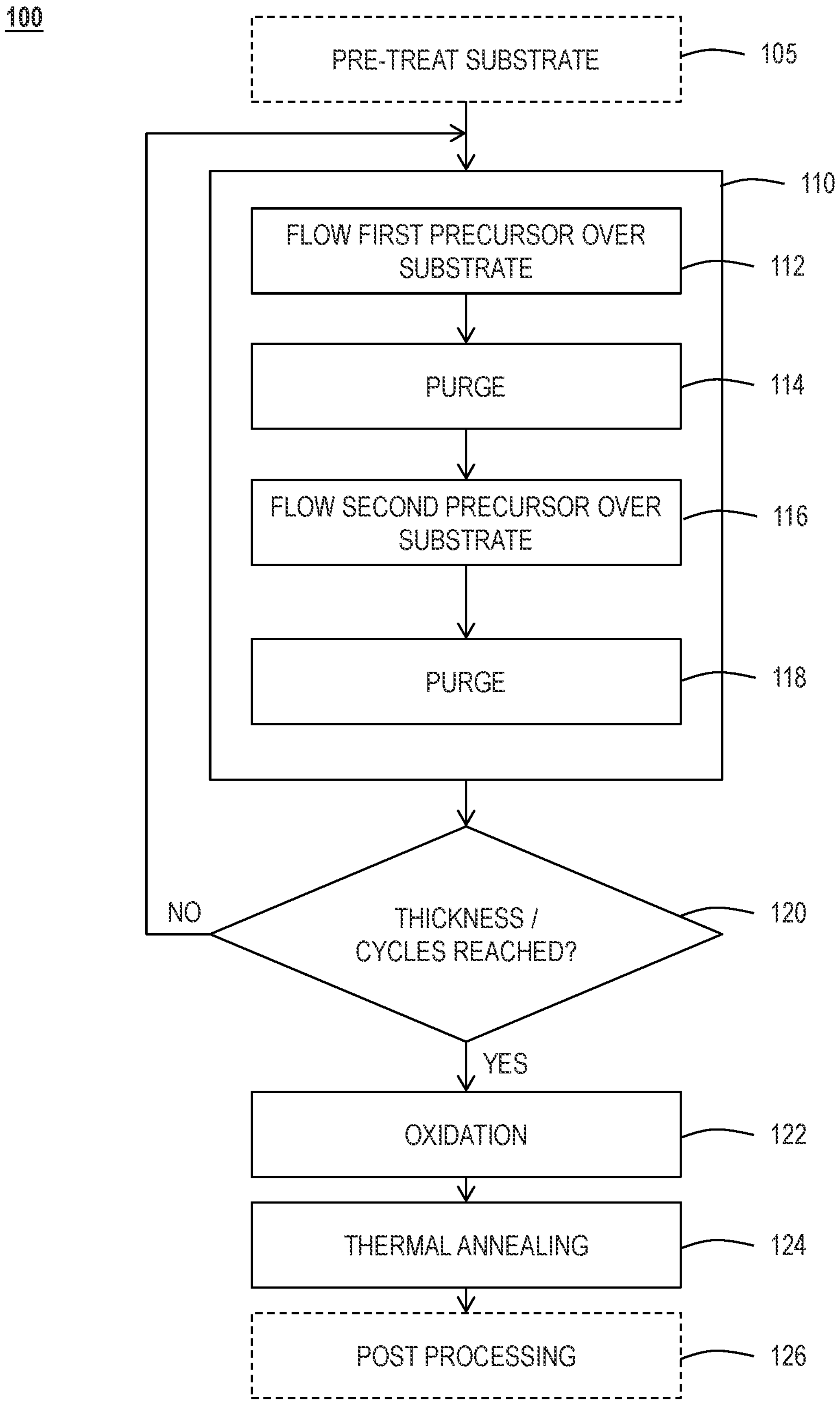
FIG. 1A illustrates a process flow diagram of a method of depositing a SiOCN film on a semiconductor substrate according to one or more embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

The term "about" as used herein means approximately or nearly and in the context of a numerical value or range set forth means a variation of ±15%, or less, of the numerical value. For example, a value differing by ±14%, ±10%, ±5%, ±2%, or ±1%, would satisfy the definition of about.

Spatially relative terms, such as "beneath," "below," "lower," "above," "upper" and the like, may be used herein for ease of description to describe one element's relationship to another element(s) or feature(s) as illustrated in the Figures. It will be understood that the spatially relative terms are intended to encompass different orientations of the semiconductor device in use or operation in addition to the orientation depicted in the Figures. For example, if the semiconductor device in the Figures is turned over, elements described as "below" or "beneath" other elements would then be oriented "above" the other elements. Thus, the exemplary term "below" may encompass both an orientation of above and below. The semiconductor device may be otherwise oriented (rotated 90 degrees or at other orientations) and the spatially relative descriptors used herein interpreted accordingly.

As used herein, the term "substrate" or "wafer" refers to a surface, or portion of a surface, upon which a process acts. It will also be understood by those skilled in the art that reference to a substrate can refer to only a portion of the substrate unless the context clearly indicates otherwise. Additionally, reference to depositing on a substrate can mean both a bare substrate and a substrate with one or more layers or features deposited or formed thereon.

A "substrate" as used herein, refers to any substrate or material surface formed on a substrate upon which layer processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, and any other materials such as metals, metal nitrides, metal alloys, and other conductive materials, depending on the application. Substrates include, without limitation, semiconductor wafers. In some embodiments, the semiconductor substrate comprises one or more of doped or undoped crystalline silicon (Si), doped or undoped crystalline silicon germanium (SiGe), doped or undoped amorphous silicon (Si), or doped or undoped amorphous silicon germanium (SiGe). Substrates may be exposed to a pretreatment process to polish, etch, reduce, oxidize, hydroxylate, anneal and/or bake the substrate surface. In addition to layer processing directly on the surface of the substrate itself, in the present disclosure, any of the layer processing steps disclosed may also be performed on an under-layer formed on the substrate as disclosed in more detail below, and the term "substrate surface" is intended to include such under-layer as the context indicates. Thus, for example, where a layer/layer or partial layer/layer has been deposited onto a substrate surface, the exposed surface of the newly deposited layer/layer becomes the substrate surface.

For the avoidance of doubt, no stoichiometric ratios are implied by the identification of materials disclosed herein. For example, a silicon oxide (SiO) material contains silicon and oxygen, a silicon nitride (SiN) material contains silicon and nitrogen, and a silicon oxynitride (SiON) material contains silicon, oxygen, and nitrogen. These elements may or may not be present at a 1:1 ratio, or a 1:1:1 ratio, unless otherwise specified herein.

It will be appreciated that the methods described herein can be implemented on any substrate surface having one or more features formed therein, one or more layers formed thereon, and combinations thereof. The shape of the feature can be any suitable shape including, but not limited to, trenches, holes and vias (circular or polygonal). As used in this regard, the term "feature" refers to any intentional surface irregularity. Suitable examples of features include but are not limited to trenches, which have a top, two sidewalls and a bottom extending into the substrate, vias which have one or more sidewall extending into the substrate to a bottom, and slot vias. The features described herein can have any suitable aspect ratio (ratio of the depth of the feature to the width of the feature). In one or more embodiments, the aspect ratio of the features described herein is greater than or equal to about 1:1, 2:1, 5:1, 10:1, 15:1, 20:1, 25:1, 30:1, 35:1, or 40:1.

The term "on" indicates that there is direct contact between elements. The term "directly on" indicates that there is direct contact between elements with no intervening elements.

As used herein, the term "in situ" refers to processes that are all performed in the same processing chamber or within different processing chambers that are connected as part of an integrated processing system, such that each of the processes are performed without an intervening vacuum break. As used herein, the term "ex situ" refers to processes that are performed in at least two different processing chambers such that one or more of the processes are performed with an intervening vacuum break. In some embodiments, processes are performed without breaking vacuum or without exposure to ambient air.

As used in this specification and the appended claims, the terms "precursor", "reactant", "reactive gas", and the like are used interchangeably to refer to any gaseous species that can react with the substrate surface.

As used herein, the term "chemical vapor deposition" refers to the exposure of at least one reactive species to deposit a layer of material on the substrate surface. In some embodiments, the chemical vapor deposition (CVD) process comprises mixing the two or more reactive species in the processing chamber to allow gas phase reactions of the reactive species and deposition. In some embodiments, the CVD process comprises exposing the substrate surface to two or more reactive species simultaneously. In some embodiments, the CVD process comprises exposing the substrate surface to a first reactive species continuously with an intermittent exposure to a second reactive species. In some embodiments, the substrate surface undergoes the CVD reaction to deposit a layer having a predetermined thickness. In the CVD process, the layer can be deposited in one exposure to the mixed reactive species or can be multiple exposures to the mixed reactive species with purges between. In some embodiments, the substrate surface is exposed to the first reactive species and the second reactive species substantially simultaneously.

As used herein, "substantially simultaneously" means that most of the duration of the first reactive species exposure overlaps with the second reactive species exposure.

As used herein, the term "purging" includes any suitable purge process that removes unreacted precursor, reaction products and by-products from the process region. The suitable purge process includes moving the substrate through a gas curtain to a portion or sector of the processing region that contains none or substantially none of the reactant. In one or more embodiments, purging the processing chamber comprises applying a vacuum. In some embodiments, purging the processing region comprises flowing a purge gas over the substrate. In some embodiments, the purge process comprises flowing an inert gas. In one or more embodiments, the purge gas is selected from one or more of nitrogen ($N_2$), helium (He), and argon (Ar). In some embodiments, the first reactive species is purged from the reaction chamber for a time duration in a range of from 0.1 seconds to 30 seconds, from 0.1 seconds to 10 seconds, from 0.1 seconds to 5 seconds, from 0.5 seconds to 30 seconds, from 0.5 seconds to 10 seconds, from 0.5 seconds to 5 seconds, from 1 seconds to 30 seconds, from 1 seconds to 10 seconds, from 1 seconds to 5 seconds, from 5 seconds to 30 seconds, from 5 seconds to 10 seconds or from 10 seconds to 30 seconds before exposing the substrate to the second reactive species.

"Cyclical deposition" or "atomic layer deposition" (ALD) refers to the sequential exposure of two or more reactive species to deposit a layer of material on a substrate surface. The substrate, or portion of the substrate, is exposed separately to the two or more reactive species which are introduced into a reaction zone of a processing chamber. In a time-domain ALD process, exposure to each reactive species is separated by a time delay to allow each compound to adhere and/or react on the substrate surface and then be purged from the processing chamber. These reactive species are said to be exposed to the substrate sequentially. In a spatial ALD process, different portions of the substrate surface, or material on the substrate surface, are exposed simultaneously to the two or more reactive species so that any given point on the substrate is substantially not exposed to more than one reactive species simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time-delay. Next, a second precursor or compound B is pulsed into the reaction zone followed by a second delay. During each time delay, a purge gas, such as argon, is introduced into the processing chamber to purge the reaction zone or otherwise remove any residual reactive species or reaction by-products from the reaction zone. Alternatively, the purge gas may flow continuously throughout the deposition process so that only the purge gas flows during the time delay between pulses of reactive species. The reactive species are alternatively pulsed until a desired layer or layer thickness is formed on the substrate surface. In either scenario, the ALD process of pulsing compound A, purge gas, compound B and purge gas is a cycle. A cycle can start with either compound A or compound B and continue the respective order of the cycle until achieving a layer with the predetermined thickness.

One or more of the layers deposited on the substrate or substrate surface are continuous. As used herein, the term "continuous" refers to a layer that covers an entire exposed surface without gaps or bare spots that reveal material underlying the deposited layer. A continuous layer may have gaps or bare spots with a surface area less than about 15% or less than about 10% of the total surface area of the layer.

One or more of the layers deposited on the substrate or substrate surface are conformal. As used herein, the term "conformal" means that the layer adapts to the contours of a feature or a layer. Conformality of a layer is typically quantified by a ratio of the average thickness of a layer deposited on the sidewalls of a feature to the average thickness of the same deposited layer on the field, or upper surface, of the substrate. As used herein, a layer that is "conformally deposited" refers to a layer where the thickness is about the same throughout. A layer which is conformal varies in thickness by less than or equal to about 5%, 2%, 1% or 0.5%. In one or more embodiments, the deposited film has a conformality greater than 90%, or greater than 91%, or greater than 92%, or greater than 93%, or greater than 94%, or greater than 95%, or greater than 96%, or greater than 97%, or greater than 98%, or greater than 99%.

Transistors are circuit components or elements that are often formed on semiconductor devices. Depending upon the circuit design, in addition to capacitors, inductors, resistors, diodes, conductive lines, or other elements, transistors are formed on a semiconductor device. Generally, a transistor includes a gate formed between source and drain regions. In one or more embodiments, the source and drain regions include a doped region of a substrate and exhibit a doping profile suitable for a particular application. The gate is positioned over the channel region and includes a gate dielectric interposed between a gate electrode and the channel region in the substrate.

As used herein, the term "field effect transistor" or "FET" refers to a transistor that uses an electric field to control the electrical behavior of the device. Enhancement mode field effect transistors generally display very high input impedance at low temperatures. The conductivity between the drain and source terminals is controlled by an electric field in the device, which is generated by a voltage difference between the body and the gate of the device. The FET's three terminals are source(S), through which the carriers enter the channel; drain (D), through which the carriers leave the channel; and gate (G), the terminal that modulates the channel conductivity. Conventionally, current entering the channel at the source(S) is designated Is and current entering the channel at the drain (D) is designated ID. Drain-to-source voltage is designated VDs. By applying voltage to gate (G), the current entering the channel at the drain (i.e., ID) can be controlled.

The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals. A MOSFET is based on the modulation of charge concentration by a metal-oxide semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p region.

If the MOSFET is a p-channel or pMOS FET, then the source and drain are p+ regions and the body is a n region. The source is so named because it is the source of the charge carriers (electrons for n-channel, holes for p-channel) that flow through the channel; similarly, the drain is where the charge carriers leave the channel.

As used herein, the term "fin field-effect transistor (FinFET)" refers to a MOSFET transistor built on a substrate where the gate is placed on two or three sides of the channel, forming a double- or triple-gate structure. FinFET devices have been given the generic name FinFETs because the channel region forms a "fin" on the substrate. FinFET devices have fast switching times and high current density.

As used herein, the term "gate all-around (GAA)," is used to refer to an electronic device, e.g., a transistor, in which the gate material surrounds the channel region on all sides. The channel region of a GAA transistor may include nanowires or nano-slabs, bar-shaped channels, or other suitable channel configurations known to one of skill in the art. In one or more embodiments, the channel region of a GAA device has multiple horizontal nanowires or horizontal bars vertically spaced, making the GAA transistor a stacked horizontal gate-all-around (hGAA) transistor.

As used herein, the term "nanowire" refers to a nanostructure, with a diameter on the order of a nanometer ($10^{-9}$ meters). Nanowires can also be defined as the ratio of the length to width being greater than 1000. Alternatively, nanowires can be defined as structures having a thickness or diameter constrained to tens of nanometers or less and an unconstrained length. Nanowires are used in transistors and some laser applications, and, in one or more embodiments, are made of semiconducting materials, metallic materials, insulating materials, superconducting materials, or molecular materials. In one or more embodiments, nanowires are used in transistors for logic CPU, GPU, MPU, and volatile (e.g., DRAM) and non-volatile (e.g., NAND) devices. As used herein, the term "nanosheet" refers to a two-dimensional nanostructure with a thickness in a scale ranging from about 0.1 nm to about 1000 nm.

Previous methods included forming a silicon carbonitride (SiCN) film on a substrate surface and exposing the SiCN film to a high temperature seal annealing process. The film was then treated by rapid thermal processing and subjected to a high temperature anneal for form a silicon oxycarbonitride (SiOCN) film having a low dielectric constant. The process of steam annealing is not compatible with the manufacture of high aspect ratio semiconductor devices, particularly GAAs.

Embodiments of the present disclosure advantageously provide methods of depositing high-quality (low wet etch rate (WER)) conformal silicon oxycarbonitride (SiOCN) films, without damaging the surrounding semiconductor structures. One or more embodiments advantageously provide a conformal oxycarbonitride (SiOCN) film as an inner spacer material for a GAA structure. Some embodiments advantageously provide methods of depositing silicon oxycarbonitride (SiOCN) films directly on a semiconductor substrate surface. As used herein, the term "high-quality" means that the deposited silicon oxycarbonitride (SiOCN) film has a wet etch rate of less than 10 Å/min in 100:1 dilute hydrofluoric acid (DHF), or a wet etch rate of less than 1 Å/min in 500:1 dilute hydrofluoric acid (DHF).

Without intending to be bound by theory, it is thought that the methods described herein advantageously convert the as-deposited silicon carbonitride (SiCN) film into a high quality (i.e., low wet etch rate) silicon oxycarbonitride (SiOCN) film. The methods described here advantageously reduce the total water ($H_2O$) soaking time, reduce film expansion that may happen during water ($H_2O$) conversion, provide the ability to obtain different film thicknesses from one recipe, make the silicon oxycarbonitride (SiOCN) film more uniform/conformal across the substrate since water/oxygen ($H_2O$, $O_2$) diffusion may not be uniform above certain thicknesses, and silicon carbonitride (SiCN) atomic layer deposition, $H_2O$ soaking, and $O_2$ annealing three steps can be done at different temperatures if performed in three different chambers.

As recognized by one of skill in the art, it is difficult to obtain conformal films having uniform compositions using plasma processes in devices having high aspect ratios, particularly the horizontal trenches/features of GAA devices. Accordingly, one or more embodiments advantageously provide thermal methods, thermal ALD methods, of depositing conformal silicon oxycarbonitride (SiOCN) films without the use of plasma and/or without the use of steam annealing. The thermal ALD methods of one or more embodiments eliminate plasma from the process to form conformal film having uniform compositions on high aspect ratio structures.

The embodiments of the disclosure are described by way of the Figures, which illustrate semiconductor devices and methods of forming films on high aspect ratio semiconductor devices, e.g., GAA devices, in accordance with one or more embodiments of the disclosure. The processes shown are merely illustrative possible uses for the disclosed processes, and the skilled artisan will recognize that the disclosed processes are not limited to the illustrated applications.

Figure 1B:
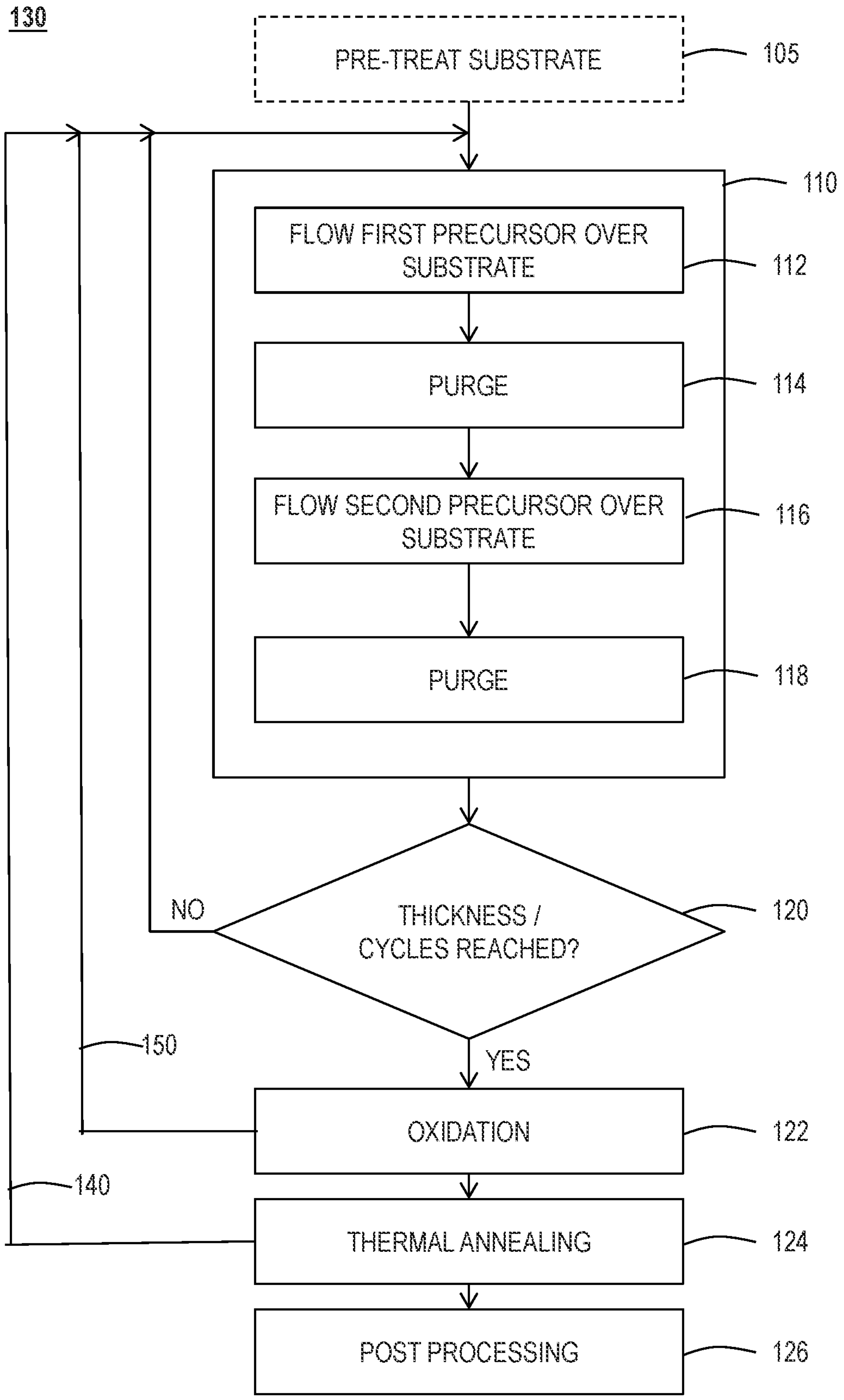
FIG. 1B illustrates a process flow diagram of a method of depositing a SiOCN film on a semiconductor substrate according to one or more embodiments of the present disclosure.
Figure 1C:
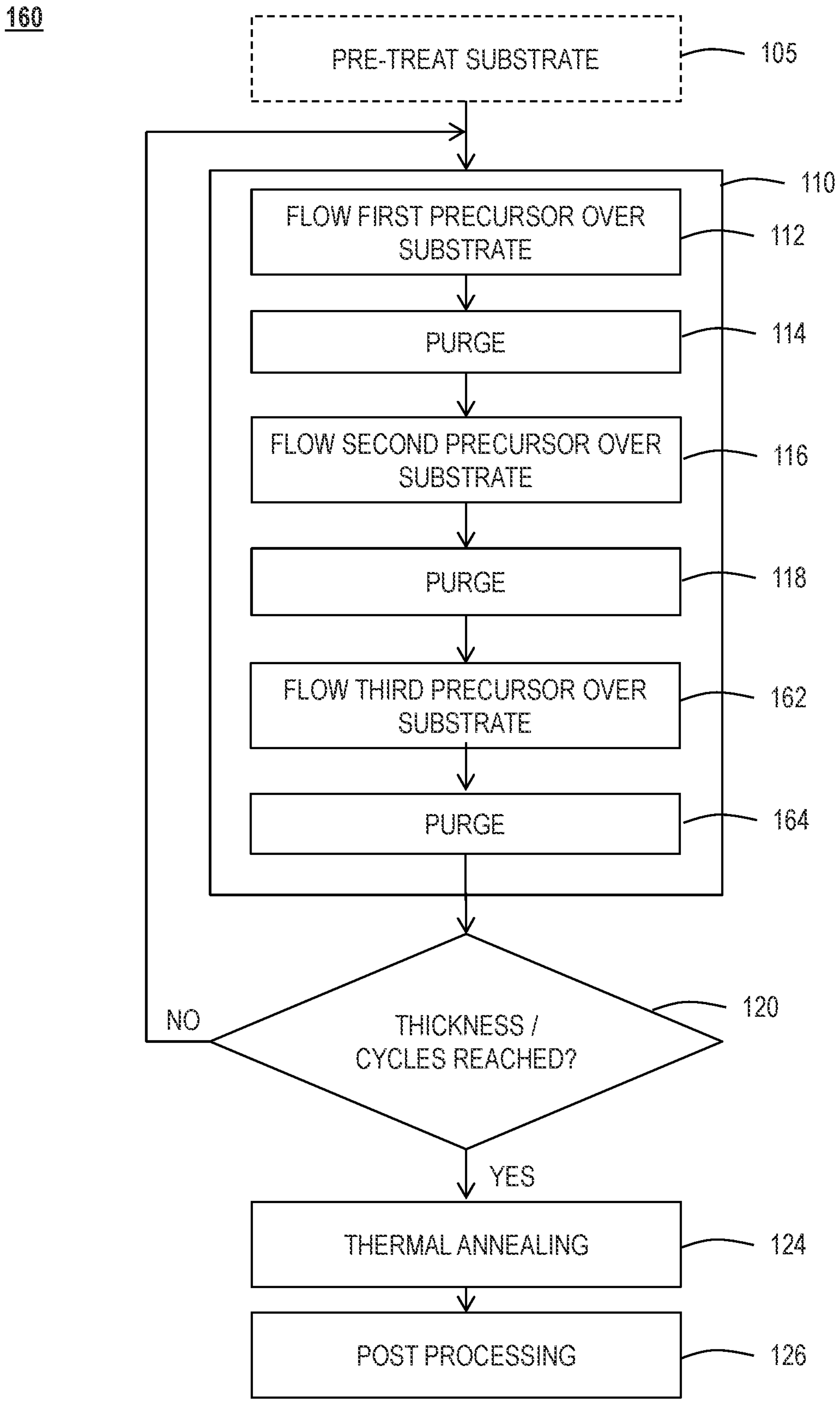
FIG. 1C illustrates a process flow diagram of a method of depositing a SiOCN film on a semiconductor substrate according to one or more embodiments of the present disclosure.
Figure 2:
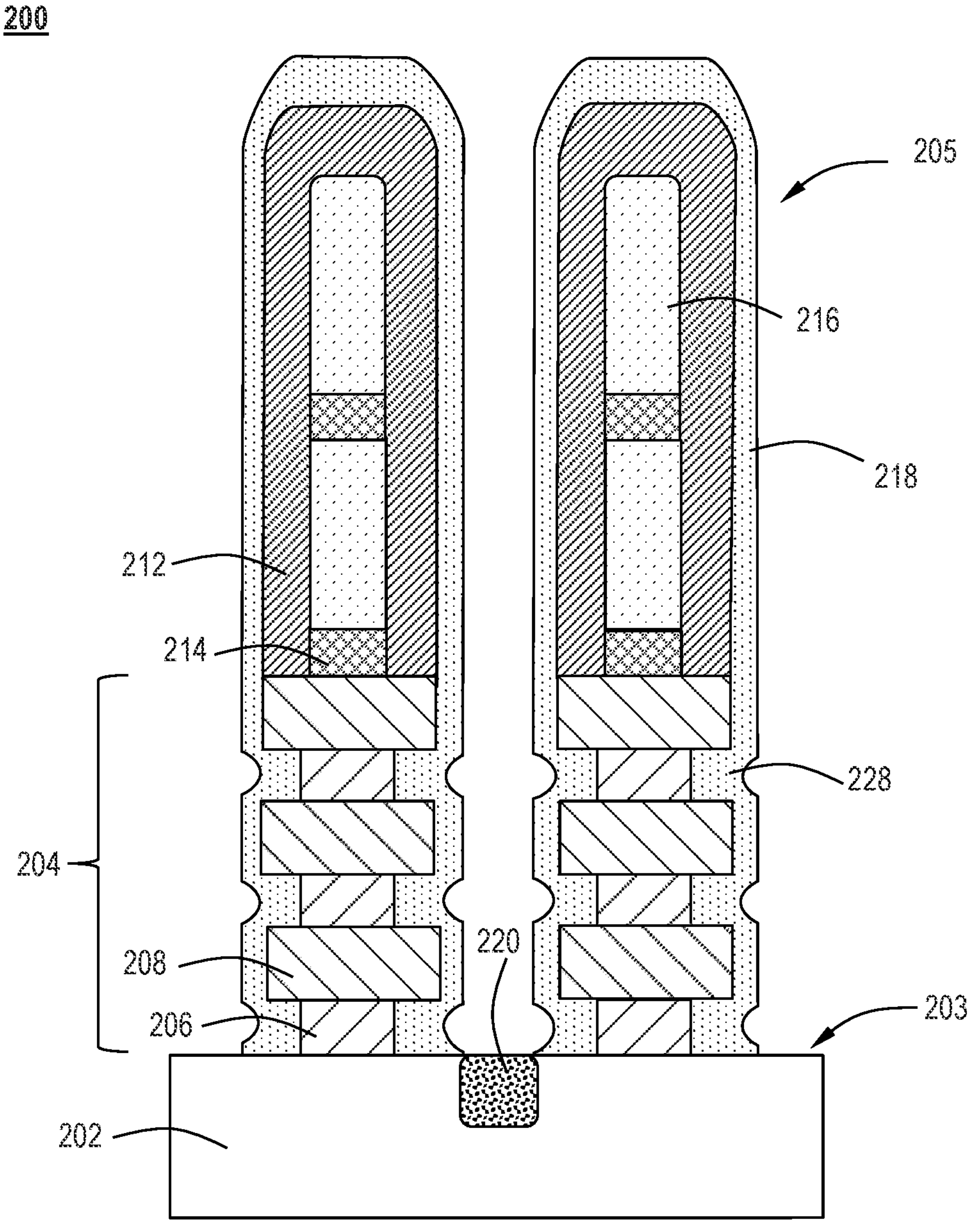
FIG. 2 illustrates a cross-sectional view of a semiconductor device, e.g., a GAA device, according to one or more embodiments of the present disclosure.
Figure 3:
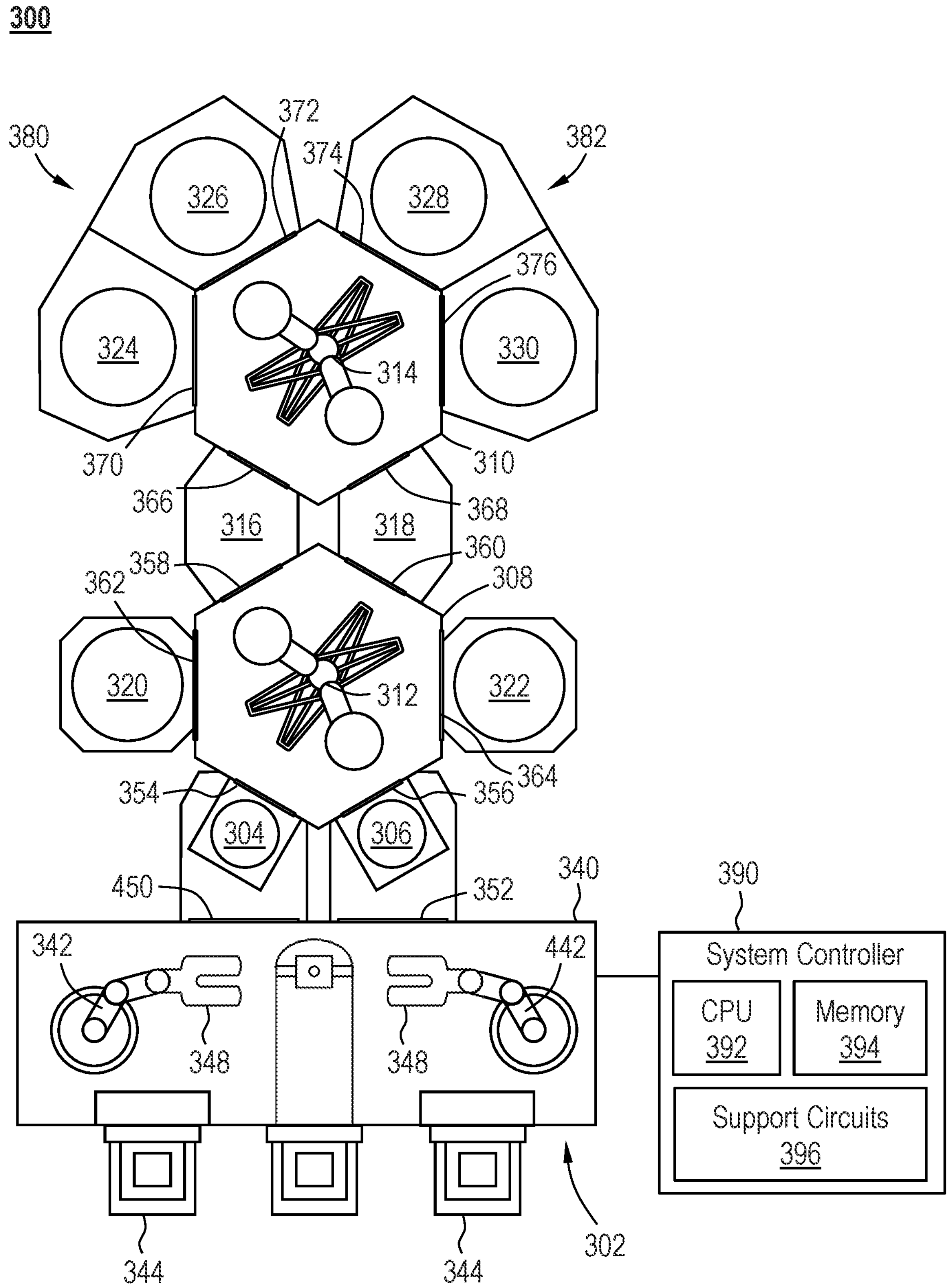
FIG. 3 illustrates a cluster tool according to one or more embodiments of the present disclosure.

FIG. 1A illustrates a process flow diagram of a method 100 of forming a film on high aspect ratio semiconductor device 200 according to one or more embodiments of the present disclosure. FIG. 1B illustrates a process flow diagram of a method 130 of forming a film on high aspect ratio semiconductor device 200 according to one or more embodiments of the present disclosure. FIG. 1C illustrates a process flow diagram of a method 160 of forming a film on high aspect ratio semiconductor device 200 according to one or more embodiments of the present disclosure. FIG. 2 illustrates a semiconductor device 200 manufactured in accordance with the methods 100, 130, and/or 160. FIG. 3 illustrates a cluster tool 300 in which any of the semiconductor devices described herein, e.g., semiconductor device 200 can be manufactured and any of the methods described herein e.g., method 100, method 130, or method 160 can be performed.

Referring to FIGS. 1A-1C, one or more embodiments of the disclosure are directed to method 100, 130, 160 of depositing a film. The methods illustrated in FIGS. 1A, 1B, and 1C are representative of an atomic layer deposition (ALD) process in which the substrate or substrate surface is exposed sequentially to the reactive gases in a manner that prevents or minimizes gas phase reactions of the reactive gases. In some embodiments, the methods may comprise a chemical vapor deposition (CVD) process in which the reactive gases are mixed in the processing chamber to allow gas phase reactions of the reactive gases and deposition of the thin film.

Referring to FIGS. 1A-1C, in one or more embodiments, the method 100 begins with optional operation 105 to pre-treat the substrate. The pre-treatment at operation 105 can be any suitable pre-treatment known to the skilled artisan. Suitable pre-treatments include, but are not limited to, pre-heating, cleaning, soaking, native oxide removal, or deposition of a layer.

Referring to FIGS. 1A and 1B, at deposition 110, a process is performed to deposit a conformal silicon carbonitride (SiCN) film on the substrate (or substrate surface). With reference to FIG. 1C, at deposition 110, a process is performed to deposit a conformal silicon oxycarbonitride (SiOCN) film on the substrate (or substrate surface). The deposition process can include one or more operations to form a film on the substrate. In operation 112, the substrate (or substrate surface) is exposed to a first precursor, e.g., a silicon- and carbon-containing precursor, to deposit a film on the substrate (or substrate surface). The silicon- and carbon-containing precursor can be any suitable compound that can react with (i.e., adsorb or chemisorb onto) the substrate surface to leave a silicon- and carbon-containing species on the substrate surface.

In one or more embodiments, the first precursor may comprise any suitable silicon- and carbon-containing precursor known to the skilled artisan. In one or more embodiments, the first precursor comprises one or more of $R_AR_B$—Si=$(CH_2)_2$=Si—$R_AR_B$, $R_CR_BR_A$—Si—$C_xH_y$—Si—$R_AR_BR_C$, which x is greater than or equal to 1 ($x \geq 1$), $R_A$, $R_B$, and $R_C$ are independently selected from halide, hydrogen (H), dimethylamino, diethylamino, alkyl, alkoxy, vinyl, and silane. In some embodiments, the first precursor comprises one or more of bis(trichlorosilyl)methane (BTCSM), and other suitable chlorosilanes.

In one or more embodiments, the first precursor comprises one or more of $(X_yH_{3-y}Si)_zCH_{4-z}$, $(X_yH_{3-y}Si)(CH_2)(SiX_pH_{2-p})(CH_2)(SiX_yH_{3-y})$, or $(X_yH_{3-y}Si)(CH_2)_n(SiX_yH_{3-y})$, wherein X is a halogen selected from CI, F, Br, and I, y has a value of between 1 and 3, and z has a value of between 1 and 3, p has a value of between 0 and 2, and n has a value between 2 and 5, including, but not limited to bis(trichlorosilyl)methane (BTCSM), hexachlorodisilylmethylene (HCDSM), 1,1'-methylenebis(1,1,1-trichlorosilane), methylenebis(trichlorosilane), $(ClSiH_2)(CH_2)(SiH_2)(CH_2)(SiH_2Cl)$, $(Cl_2SiH)(CH_2)(SiClH)(CH_2)(SiHCl_2)$. In other embodiments, the first precursor has a structure of general formula (I)

(I)

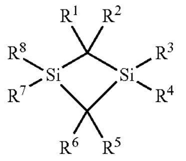

wherein $R^1$, $R^2$, $R^3$, $R^4$, $R^5$, $R^6$, $R^7$, and $R^8$ are independently selected from hydrogen (H), alkyl, alkoxy, vinyl, silane, amine, or halide.

In other embodiments, the first precursor has a structure of general formula (II)

(II)

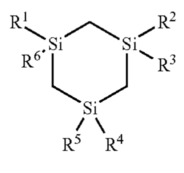

wherein $R^1$, $R^2$, $R^3$, $R^4$, $R^5$, and $R^6$ are independently selected from hydrogen (H), alkyl, alkoxy, vinyl, silane, amine, or halide.

Unless otherwise indicated, the term "lower alkyl," "alkyl," or "alk" as used herein alone or as part of another group includes both straight and branched chain hydrocarbons, containing 1 to 24 carbons, in the normal chain, such as methyl, ethyl, propyl, isopropyl, butyl, t-butyl, isobutyl, pentyl, hexyl, isohexyl, heptyl, 4,4-dimethylpentyl, octyl, 2,2,4-trimethyl-pentyl, nonyl, decyl, undecyl, dodecyl, the various branched chain isomers thereof, and the like. Such groups may optionally include up to 1 to 4 substituents.

As used herein, the term "alkoxy" includes any of the above alkyl groups linked to an oxygen atom.

As used herein, the terms "vinyl" or "vinyl-containing" refer to groups containing the vinyl group (—CH=$CH_2$).

As used herein, the term "amine" relates to any organic compound containing at least one basic nitrogen atom, e.g., $NR'_2$, wherein R' is independently selected from hydrogen (H) or alkyl.

As used herein, the term "silane" refers to a compound $SiR'_3$, wherein R' is independently selected from hydrogen (H) or alkyl.

As used herein, the term "halide" refers to a binary phase, of which one part is a halogen atom and the other part is an element or radical that is less electronegative than the halogen, to make a fluoride, chloride, bromide, iodide, or astatide compound. A halide ion is a halogen atom bearing a negative charge. As known to those of skill in the art, a halide anion includes fluoride (F—), chloride (Cl—), bromide (Br—), iodide (I—), and astatide (At—).

In one or more specific embodiments, the first precursor of general formula (I) comprises one or more of diethoxydimethylsilacyclobutane (EMSCB) or tetramethylsilacyclobutane (TMSCB).

The deposition 110 can occur at any suitable temperature, pressure, and exposure duration known to the skilled artisan. In some embodiments, the substrate (or substrate surface) is exposed to a first precursor and a second precursor at a pressure in a range of from 0.1 Torr to 100 Torr, or in a range of from 1 Torr to 50 Torr, and at a temperature in a range of from 200° C. to 550° C.

As used herein, a "substrate surface" refers to any substrate surface upon which a layer may be formed. The substrate surface may have one or more features formed therein, one or more layers formed thereon, and combinations thereof. The substrate (or substrate surface) may be pretreated prior to the deposition of the conformal silicon carbonitride (SiCN) film, for example, by polishing, etching, reduction, oxidation, halogenation, hydroxylation, annealing, baking, or the like. In some embodiments, as those illustrated in FIG. 2, the substrate surface is part of a gate-all-around (GAA) device such that the conformal silicon oxycarbonitride (SiOCN) film that is deposited forms the inner spacer of the GAA.

At operation 114, the processing chamber or substrate surface is purged to remove unreacted first precursor, reaction products, and by-products. As used in this manner, the term "processing chamber" also includes portions of a processing chamber adjacent to the substrate surface without encompassing the complete interior volume of the processing chamber. For example, in a sector of a spatially separated processing chamber, the portion of the processing chamber adjacent the substrate surface is purged of the first precursor by any suitable technique including, but not limited to, moving the substrate through a gas curtain to a portion or sector of the processing chamber that contains none or substantially none of the first precursor. In one or more embodiments, purging the processing chamber comprises applying a vacuum. In some embodiments, purging the processing chamber comprises flowing a purge gas over the substrate. In some embodiments, the portion of the processing chamber refers to a micro-volume or small volume process station within a processing chamber. The term "adjacent" referring to the substrate surface means the physical space next to the surface of the substrate which can provide sufficient space for a surface reaction (e.g., precursor adsorption) to occur. In one or more embodiments, the purge gas is selected from one or more of nitrogen ($N_2$), helium (He), and argon (Ar). Purging the processing chamber, portion of the processing chamber, area adjacent the substrate surface, etc., removes unreacted reactants, reaction products, and by-products from the area adjacent the substrate surface.

At operation 116, the substrate (or substrate surface) is exposed to a second precursor to form a silicon carbonitride (SiCN) film on the substrate. The second precursor may comprise any suitable precursor known to the skilled artisan. In some embodiments, the second precursor is selected from the group consisting of ammonia ($NH_3$), hydrazine ($N_2H_4$), organic diamines ($NH_2$—R—$NH_2$) where R is an alkyl group, e.g., ethylenediamine, and diazene ($N_2H_2$). The second precursor can react with the silicon- and carbon-containing species on the substrate surface to form the silicon carbonitride (SiCN) film.

Exposure to the second precursor at operation 116 can occur at any suitable temperature, pressure, and exposure duration known to the skilled artisan. In some embodiments, the substrate (or substrate surface) is exposed to the second precursor at a pressure in a range of from 0.1 Torr to 100 Torr, or in a range of from 1 Torr to 50 Torr, and at a temperature in a range of from 200° C. to 550° C.

As recognized by one of skill in the art, the order that the substrate or substrate surface is exposed to the precursors may be reversed. For example, in some embodiments, the substrate or substrate surface may be exposed to the second precursor at operation 112, followed by exposure to the first precursor at operation 116.

In one or more embodiments, the carbon (C) and nitrogen (N) content of the silicon carbonitride (SiCN) film and silicon oxycarbonitride (SiOCN) film may be tunable by changing which first precursor and which second precursor is used. In one or more embodiments, the silicon oxycarbonitride (SiOCN) film formed by method 100, method 130, or method 160 has a carbon concentration in a range of from greater than 0 atomic percent (at. %) to 20 atomic percent (at. %), and a nitrogen concentration in a range of from greater than 0 atomic percent (at. %) to 20 atomic percent (at. %).

At operation 118, the processing chamber is purged after exposure to the second precursor. Purging the processing chamber in operation 118 can be the same process or different process than the purge in operation 114. Purging the processing chamber, portion of the processing chamber, area adjacent the substrate surface, etc., removes unreacted silane reactant, reaction products, and by-products from the area adjacent the substrate surface.

With reference to FIG. 1C, in the method 160, after purging at operation 118, the substrate or substrate surface may be exposed to a third precursor at operation 162. The third precursor may comprise any suitable precursor known to the skilled artisan. In one or more embodiments, the third precursor comprises one or more of water ($H_2O$), hydrogen peroxide ($H_2O_2$), or an organic oxidizing agent, including, but not limited to, carboxylic acid, alcohol, acetic acid, and ethylene glycol. Without intending to be bound by theory, it is thought that exposing the silicon carbonitride (SiCN) film formed after operation 118 to the third precursor will provide a silicon oxycarbonitride (SiOCN) film without the need for an additional oxidation operation 122, as required according to the method 100, 130 of FIGS. 1A-1B.

Still referring to FIG. 1C, at operation 162, the processing chamber is purged after exposure to the third precursor. Purging the processing chamber in operation 162 can be the same process or different process than the purge in operations 114 and 118. Purging the processing chamber, portion of the processing chamber, area adjacent the substrate surface, etc., removes unreacted silane reactant, reaction products, and by-products from the area adjacent the substrate surface.

With reference to FIGS. 1A-1C, at decision 120, the thickness of the deposited film, or number of cycles of first precursor and the second precursor, and third precursor in method 160, is considered. If the deposited film has reached a predetermined thickness or a predetermined number of process cycles have been performed, the method 100 moves to the oxidation operation 122. If the thickness of the deposited silicon carbonitride (SiCN) film (or the silicon oxycarbonitride (SiOCN) film with respect to method 160) or the number of process cycles has not reached the predetermined threshold, the method 100 returns to deposition 110 to expose the substrate surface to the first precursor again in operation 112 and continuing.

In one or more embodiments, the silicon carbonitride (SiCN) film formed by methods 100, 130 may have any suitable thickness. The skilled artisan will recognize that the particular thickness of the silicon carbonitride (SiCN) film may depend on the particular application. In some embodiments, the deposited silicon carbonitride (SiCN) film has a thickness in a range of from 1 Å to 200 Å, including in a range of from 5 Å to 100 Å, and a range of from 10 Å to 60 Å.

Referring to FIGS. 1A and 1B, at operation 122 in the methods 100, 130, the substrate or substrate surface having the silicon carbonitride (SiCN) film thereon is oxidized in an oxidizing environment of water ($H_2O$) and oxygen ($O_2$) to form the desired silicon oxycarbonitride (SiOCN) film. In one or more embodiments, the oxidation of operation 122 includes one or more of air aging at room temperature or at high temperature (baking); in situ or ex situ of air, or $H_2O$, or $O_3$, or $H_2O_2$, or $O_2$, or mixtures of air, or $H_2O$, or $O_3$, or $H_2O_2$, or $O_2$ with an inert gas, annealing in a chamber at a pressure in a range of from 0.1 Torr to 1000 Torr at a temperature in a range of from 20° C. to 550° C. for a period of time in a range of from >0 seconds to 10 days.

In one or more embodiments, the silicon oxycarbonitride (SiOCN) film formed by methods 100, 130, 160 may have any suitable thickness. The skill artisan will recognize that the particular thickness of the silicon oxycarbonitride (SiOCN) film may depend on the particular application. In some embodiments, the silicon oxycarbonitride (SiOCN) film has a thickness in a range of from 1 Å to 200 Å, including in a range of from 5 Å to 100 Å, and a range of from 10 Å to 60 Å.

With reference to FIGS. 1A-1C, the methods 100, 130, and 160 include subjecting the substrate or substrate surface having the silicon oxycarbonitride film (SiOCN) film thereon to a thermal anneal process at operation 124. The thermal anneal may comprise any suitable thermal anneal process known to one of skill in the art. In one or more embodiments, thermal annealing is conducted at a temperature of greater than 200° C. in an atmosphere of one or more of oxygen ($O_2$), ozone ($O_3$), and an inert gas, such as argon (Ar), helium (He), nitrogen ($N_2$), and neon (Ne). In some embodiments, the thermal annealing is conducted under vacuum. In one or more embodiments, the thermal annealing may be conducted for a time period of greater than 0 seconds to 100 hours.]

In one or more embodiments, the silicon oxycarbonitride (SiOCN) film formed by method 100, method 130, or method 160 is resistant to etching by dilute hydrofluoric acid (1% DHF). Accordingly, in one or more embodiments, the wet etch rate (WER) of the silicon oxycarbonitride (SiOCN) film after thermal anneal is low. In some embodiments, the WER in diluted hydrofluoric acid (DHF) solution is less than 10 Å/min in 100:1 DHF. In other embodiments, the WER of the silicon oxycarbonitride (SiOCN) film after thermal anneal is less than 1 Å/min in 500:1 DHF.

In one or more embodiments, the silicon oxycarbonitride (SiOCN) film that is formed according to the method 100, or the method 130, or the method 160 has a dielectric constant that is less than 4.5, including less than 4, and less than 3.5.

In one or more embodiments, the silicon oxycarbonitride (SiOCN) film formed by method 100, method 130, or method 160 is resistant to hydrogen ($H_2$) plasma and oxygen ($O_2$) plasma ashing.

Referring to FIGS. 1A-1C, the optional post-processing operation 126 can be, for example, a process to modify film properties (e.g., annealing) or a further film deposition process (e.g., additional ALD or CVD processes) to grow additional films. In one or more embodiments, the optional post-processing operation 126 can be a process that modifies a property of the deposited film. In one or more embodiments, the optional post-processing operation 126 comprises one or more of hydrogen ($H_2$), methane ($CH_4$), or ammonia ($NH_3$) plasma treatment. The hydrogen ($H_2$), methane ($CH_4$), or ammonia ($NH_3$) plasma may be mixed with one or more inert gas, such as, but not limited to, argon (Ar), helium (He), nitrogen ($N_2$), and neon (Ne). The plasma may be one or more of an inductively coupled plasma (ICP), remote plasma source (RPS), microwave, RPS microwave, or capacitively coupled plasma (CCP).

Referring to FIGS. 1A-1C, the deposition 110 can be repeated one or more times to obtain a film having the desired thickness. In one or more embodiments, the deposition 110 is repeated n times where n is an integer in a range of from 1 to 1000, including in a range of from 1 to 500, or in a range of from 1 to 350, or in a range of from 1 to 100, or in a range of from 1 to 50, or in a range of from 1 to 10.

With reference to FIG. 1B, the deposition 110 in combination with the oxidation 122 and thermal annealing 124 form a super cycle 140 which may be repeated one or more times. In some embodiments, the super cycle 140 may be repeated m number of times, where m is an integer in a range of from 1 to 1000, including in a range of from 1 to 500, or in a range of from 1 to 350, or in a range of from 1 to 100, or in a range of from 1 to 50, or in a range of from 1 to 10.

In other embodiments, referring to FIG. 1B, the deposition in combination with the oxidation operation 122 form a second super cycle 150 which may be repeated one or more times. In some embodiments, the second super cycle 150 may be repeated p numbers of times, where p is an integer in a range of from 1 to 1000, including in a range of from 1 to 500, or in a range of from 1 to 350, or in a range of from 1 to 100, or in a range of from 1 to 50, or in a range of from 1 to 10.

In one or more embodiments, the semiconductor device that is processing according to the method 100, or the method 130, or the method 160 is a logic device or a memory device. In some embodiments, the semiconductor device is a logic device, such as a gate-all-around (GAA), as illustrated in FIG. 2. As will be appreciated by the skilled artisan, the semiconductor device (e.g., the logic device or the memory device) will include the silicon oxycarbonitride (SiOCN) film formed according to the methods 100, 130, 160 of one or more embodiments along with any additional features or components to form the respective logic device or memory device. The skilled artisan will be able to implement appropriate functionality to a logic device or a memory device based on the above description without undue experimentation.

FIG. 2 is a cross-section view of a device 200 according to one or more embodiments. The device 200 has a substrate 202. In some embodiments, the substrate 202 may be a bulk semiconductor substrate. As used herein, the term "bulk semiconductor substrate" refers to a substrate in which the entirety of the substrate is comprised of a semiconductor material. The bulk semiconductor substrate 202 may comprise any suitable semiconducting material and/or combinations of semiconducting materials for forming a semiconductor structure. For example, the semiconducting layer may comprise one or more materials such as crystalline silicon (e.g., Si<100> or Si<111>), silicon oxide, strained silicon, silicon germanium, doped or undoped polysilicon, doped or undoped silicon wafers, patterned or non-patterned wafers, doped silicon, germanium, gallium arsenide, or other suitable semiconducting materials. In some embodiments, the semiconductor material is silicon (Si). In one or more embodiments, the semiconductor substrate 202 comprises a semiconductor material, e.g., silicon (Si), carbon (C), germanium (Ge), silicon germanium (SiGe), germanium tin (GeSn), other semiconductor materials, or any combination thereof. In one or more embodiments, the substrate 202 comprises one or more of silicon (Si), germanium (Ge), gallium (Ga), arsenic (As), or phosphorus (P). Although a few examples of materials from which the substrate may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In some embodiments, the semiconductor material may be a doped material, such as n-doped silicon (n-Si), or p-doped silicon (p-Si). In some embodiments, the substrate may be doped using any suitable process such as an ion implantation process. As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semiconductors, holes are the majority carriers and electrons are the minority carriers. In one or more embodiments, the dopant is selected from one or more of boron (B), gallium (Ga), phosphorus (P), arsenic (As), other semiconductor dopants, or combinations thereof. In some embodiments, the substrate 202 may be doped to provide a high dose of dopant at a first location of the surface of the substrate 202 in order to prevent parasitic bottom device turn on. For example, in some embodiments, the surface of the substrate may have a dopant density of about $10^{18}$ atoms/$cm^3$ to about $10^{19}$ atoms/$cm^3$.

At least one superlattice structure 204 is formed atop the top surface 203 of the substrate 202. The superlattice structure 204 comprises a plurality of semiconductor material layers 208 and a corresponding plurality of release layers 206 alternatingly arranged in a plurality of stacked pairs and extending between a source/drain region 220 on the substrate 202. In some embodiments the plurality of stacked groups of layers comprises a silicon (Si) layer 208 and silicon germanium (SiGe) layer 206. In some embodiments, the plurality of semiconductor material layers 208 and corresponding plurality of release layers 206 can comprise any number of lattice matched material pairs suitable for forming a superlattice structure 204. In some embodiments, the plurality of semiconductor material layers 208 and corresponding plurality of release layers 206 comprise from about 2 to about 50 pairs of lattice matched materials.

In some embodiments, the source region 220 is formed adjacent a first end of the superlattice structure 204 and the drain region 220 is formed adjacent a second, opposing end of the superlattice structure 204. In some embodiments, the source region 220 and/or drain region 220 are formed from any suitable semiconductor material, such as but not limited to silicon, germanium, silicon germanium, doped SiGe (PFET) or doped Si (NFET) where the dopants are B, P, Sn, C, or the like.

Typically, a parasitic device (not illustrated) will exist at the bottom of the superlattice structure 204. In some embodiments, implantation of a dopant in the substrate 202, as discussed above, is used to suppress the turn on of the parasitic device. In some embodiments, the substrate 202 is etched so that the bottom portion of the superlattice structure 204 includes a substrate portion which is not removed, allowing the substrate portion to act as the bottom release layer of the superlattice structure 204.

In one or more embodiments, the thicknesses of the semiconductor material layers 208 and release layers 206 in some embodiments are in the range of from about 2 nm to about 50 nm, in the range of from about 3 nm to about 20 nm, or in a range of from about 2 nm to about 15 nm. In some embodiments, the average thickness of the semiconductor material layers 208 is within 0.5 to 2 times the average thickness of the release layers 206.

In one or more embodiments, a dummy gate structure 205 is formed over and adjacent to the superlattice structure 204. The dummy gate structure 205 defines the channel region of the transistor device. The dummy gate structure 205 may be formed using any suitable conventional deposition and patterning process known in the art. In one or more embodiments, the dummy gate structure 205 includes one or more of a gate oxide 214, a hardmask 216, and a gate spacer sidewall 212.

In one or more embodiments, a spacer material 218 is formed along outer sidewalls of the dummy gate structure 205 and the forms the inner spacer 228 of the superlattice structure 204. The spacer material 218 and the inner spacer 228 are formed according to the method 100, or method 130, or method 160 of one or more embodiments, as described above. In one or more embodiments, the inner spacer 228 comprises a silicon oxycarbonitride (SiOCN) film formed according to method 100, or method 130, or method 160 of one or more embodiments, as described above. In one or more embodiments, the silicon oxycarbonitride (SiOCN) film that forms the inner spacer 228 is conformal, having a conformality of greater than 90% or greater than 95%, and is of high quality having a low wet etch rate, as described above.

According to one or more embodiments, the semiconductor processing chamber in which the methods, e.g., method 100, method 130, and/or method 160 are performed can be maintained at processing conditions, and the processing conditions may be modified based on the particular application. In specific embodiments, as will be appreciated by the skilled artisan, the processing conditions may be modified based upon the type of semiconductor device being manufactured, e.g., a logic device or a memory device.

The semiconductor processing chamber in which the methods, e.g., method 100, method 130, and/or method 160 are performed can be maintained at any suitable temperature. In some embodiments, the semiconductor processing chamber is maintained at a temperature in a range of from >200° C. to 600° C.

FIG. 3 illustrates a schematic top-view diagram of an example of a multi-chamber processing system 300 according to embodiments of the present disclosure. The processing system 300 generally includes a factory interface 302, load lock chambers 304, 306, transfer chambers 308, 310 with respective transfer robots 312, 314, holding chambers 316, 318, and processing chambers 320, 322, 324, 326, 328, 330. As detailed herein, wafers in the processing system 300 can be processed in and transferred between the various chambers without exposing the wafers to an ambient environment exterior to the processing system 300 (e.g., an atmospheric ambient environment such as may be present in a fab). For example, the wafers can be processed in and transferred between the various chambers in a low pressure (e.g., less than or equal to about 300 Torr) or vacuum environment without breaking the low pressure or vacuum environment between various processes performed on the wafers in the processing system 300. Accordingly, the processing system 300 may provide an integrated solution for some processing of wafers.

In the illustrated example of FIG. 3, the factory interface 302 includes a docking station 340 and factory interface robots 342 to facilitate transfer of wafers. The docking station 340 is configured to accept one or more front opening unified pods (FOUPs) 344. In some examples, each factory interface robot 342 generally comprises a blade 348 disposed on one end of the respective factory interface robot 342 configured to transfer the wafers from the factory interface 302 to the load lock chambers 304, 306.

The load lock chambers 304, 306 have respective ports 350, 352 coupled to the factory interface 302 and respective ports 354, 356 coupled to the transfer chamber 308. The transfer chamber 308 further has respective ports 358, 360 coupled to the holding chambers 316, 318 and respective ports 362, 364 coupled to processing chambers 320, 322. Similarly, the transfer chamber 310 has respective ports 366, 368 coupled to the holding chambers 316, 318 and respective ports 370, 372, 374, 376 coupled to processing chambers 324, 326, 328, 330. The ports 354, 356, 358, 360, 362, 364, 366, 368, 370, 372, 374, 376 can be, for example, slit valve openings with slit valves for passing wafers therethrough by the transfer robots 312, 314 and for providing a seal between respective chambers to prevent a gas from passing between the respective chambers. Generally, any port is open for transferring a wafer therethrough. Otherwise, the port is closed.

The load lock chambers 304, 306, transfer chambers 308, 310, holding chambers 316, 318, and processing chambers 320, 322, 324, 326, 328, 330 may be fluidly coupled to a gas and pressure control system (not specifically illustrated). The gas and pressure control system can include one or more gas pumps (e.g., turbo pumps, cryo-pumps, roughing pumps), gas sources, various valves, and conduits fluidly coupled to the various chambers. In operation, a factory interface robot 342 transfers a wafer from a FOUP 344 through a port 350 or 352 to a load lock chamber 304 or 306. The gas and pressure control system then pumps down the load lock chamber 304 or 306. The gas and pressure control system further maintains the transfer chambers 308, 310 and holding chambers 316, 318 with an interior low pressure or vacuum environment (which may include an inert gas). Hence, the pumping down of the load lock chamber 304 or 306 facilitates passing the wafer between, for example, the atmospheric environment of the factory interface 302 and the low pressure or vacuum environment of the transfer chamber 308.

With the wafer in the load lock chamber 304 or 306 that has been pumped down, the transfer robot 312 transfers the wafer from the load lock chamber 304 or 306 into the transfer chamber 308 through the port 354 or 356. The transfer robot 312 is then capable of transferring the wafer to and/or between any of the processing chambers 320, 322 through the respective ports 362, 364 for processing and the holding chambers 316, 318 through the respective ports 358, 360 for holding to await further transfer. Similarly, the transfer robot 314 is capable of accessing the wafer in the holding chamber 316 or 318 through the port 366 or 368 and is capable of transferring the wafer to and/or between any of the processing chambers 324, 326, 328, 330 through the respective ports 370, 372, 374, 376 for processing and the holding chambers 316, 318 through the respective ports 366, 368 for holding to await further transfer. The transfer and holding of the wafer within and among the various chambers can be in the low pressure or vacuum environment provided by the gas and pressure control system.

The processing chambers 320, 322, 324, 326, 328, 330 can be any appropriate chamber for processing a wafer. In some embodiments, the processing chamber 320 can be capable of performing an annealing process, the processing chamber 322 can be capable of performing a cleaning process, and the processing chambers 324, 326, 328, 330 can be capable of performing epitaxial growth processes. In some examples, the processing chamber 322 can be capable of performing a cleaning process, the processing chamber 320 can be capable of performing an etch process, and the processing chambers 324, 326, 328, 330 can be capable of performing respective epitaxial growth processes. The processing chamber 322 may be a preclean chamber. The processing chamber 320 may be an etch chamber.

A system controller 390 is coupled to the processing system 300 for controlling the processing system 300 or components thereof. For example, the system controller 390 may control the operation of the processing system 300 using a direct control of the chambers 304, 306, 308, 316, 318, 310, 320, 322, 324, 326, 328, 330 of the processing system 300 or by controlling controllers associated with the chambers 304, 306, 308, 316, 318, 310, 320, 322, 324, 326, 328, 330. In operation, the system controller 390 enables data collection and feedback from the respective chambers to coordinate performance of the processing system 300.

The system controller 390 generally includes a central processing unit (CPU) 392, memory 394, and support circuits 396. The CPU 392 may be one of any form of a general-purpose processor that can be used in an industrial setting. The memory 394, or non-transitory computer-readable medium, is accessible by the CPU 392 and may be one or more of memory such as random-access memory (RAM), read only memory (ROM), floppy disk, hard disk, or any other form of digital storage, local or remote. The support circuits 396 are coupled to the CPU 392 and may comprise cache, clock circuits, input/output subsystems, power supplies, and the like. The various methods disclosed herein may generally be implemented under the control of the CPU 392 by the CPU 392 executing computer instruction code stored in the memory 394 (or in memory of a particular process chamber) as, for example, a software routine. When the computer instruction code is executed by the CPU 392, the CPU 392 controls the chambers to perform processes in accordance with the various methods.

Other processing systems can be in other configurations. For example, more or fewer processing chambers may be coupled to a transfer apparatus. In the illustrated example, the transfer apparatus includes the transfer chambers 308, 310 and the holding chambers 316, 318. In other examples, more or fewer transfer chambers (e.g., one transfer chamber) and/or more or fewer holding chambers (e.g., no holding chambers) may be implemented as a transfer apparatus in a processing system.

Processes may generally be stored in the memory of the system controller 390 as a software routine that, when executed by the processor, causes the process chamber to perform processes of the present disclosure. The software routine may also be stored and/or executed by a second processor (not shown) that is remotely located from the hardware being controlled by the processor. Some or all of the methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

Embodiments of the disclosure are directed to a non-transitory computer readable medium. In one or more embodiments, the non-transitory computer readable medium includes instructions that, when executed by a controller of a processing chamber, causes a processing chamber to perform the operations of any of the methods (e.g., method 100, 130, 160) described herein. In one or more embodiments, the controller causes a processing chamber to perform the operations of method 100, or method 130, or method 160.

The use of the terms “a” and “an” and “the” and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., “such as”) provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of depositing a film on a semiconductor device, the method comprising:

a first deposition cycle comprising exposing a semiconductor substrate in a semiconductor processing chamber to a first precursor, a first purge gas, a second precursor, and a second purge gas to deposit a conformal silicon carbonitride (SiCN) film, wherein the first precursor is a silicon- and carbon-containing precursor, and the second precursor comprises one or more of ammonia ($NH_3$), a diamine ($NH_2$—R—$NH_2$ wherein R is an alkyl group), hydrazine ($N_2H_4$), and diazene ($N_2H_2$);

oxidizing the conformal silicon carbonitride (SiCN) film to form a conformal silicon oxycarbonitride (SiOCN) film; and thermally annealing the silicon oxycarbonitride (SiOCN) film to form a high-quality conformal silicon oxycarbonitride (SiOCN) film having a wet etch rate less than 10 Å/min in 100:1 dilute hydrofluoric acid (DHF).

2. The method of claim 1, wherein the high-quality conformal silicon oxycarbonitride (SiOCN) film has a dielectric constant is less than 4.5.

3. The method of claim 1, wherein oxidizing the conformal silicon carbonitride (SiCN) film comprises exposing the silicon carbonitride (SiCN) film to a third precursor, the third precursor comprising one or more of water ($H_2O$) and hydrogen peroxide ($H_2O_2$), or an organic oxidizing agent.

4. The method of claim 1, wherein oxidizing the conformal silicon carbonitride (SiCN) film comprises exposing the conformal silicon carbonitride (SiCN) film to an oxidizing environment of water ($H_2O$) and oxygen ($O_2$).

5. The method of claim 1, wherein thermally annealing treating the conformal silicon oxycarbonitride (SiOCN) film with one or more of oxygen ($O_2$), ozone ($O_3$), and an inert gas at a temperature greater than 200° C.

6. The method of claim 1, wherein the first deposition cycle is repeated n number of times, wherein n is an integer in a range of from 1 to 1000.

7. The method of claim 1, wherein the first deposition cycle, the oxidizing, and the thermally annealing form a first super cycle that is repeated m number of times, wherein m is an integer in a range of from 1 to 1000.

8. The method of claim 1, wherein the first deposition cycle and the oxidizing form a second super cycle that is repeated p number of times, wherein p is an integer in a range of from 1 to 1000.

9. The method of claim 1, wherein the first deposition cycle is performed at a temperature in a range of from 200° C. to 550° C.

10. The method of claim 1, wherein the first purge gas and the second purge gas are independently selected from argon (Ar), helium (He), and nitrogen ($N_2$).

11. A method of manufacturing a gate-all-around device, the method comprising:

in a first deposition cycle, exposing a substrate comprising a dummy gate structure on a top surface of a superlattice structure in a semiconductor processing chamber to a first precursor comprising a silicon- and carbon-containing precursor, a first purge gas, a second precursor comprising one or more of ammonia ($NH_3$), a diamine ($NH_2$—R—$NH_2$ wherein R is an alkyl group), hydrazine ($N_2H_4$), and diazene ($N_2H_2$), and a second purge gas to deposit a conformal silicon carbonitride (SiCN) film as an inner spacer on the superlattice structure, the superlattice structure including a plurality of semiconductor material layers and a corresponding plurality of release layers alternatingly arranged in a plurality of stacked pairs;

oxidizing the conformal silicon carbonitride (SiCN) film to form a silicon oxycarbonitride (SiOCN) film; and thermally annealing the conformal silicon oxycarbonitride (SiOCN) film to form a high-quality conformal silicon oxycarbonitride (SiOCN) film having a wet etch rate less than 10 Å/min in 100:1 dilute hydrofluoric acid (DHF).

12. The method of claim 11, wherein the high-quality conformal silicon oxycarbonitride (SiOCN) film has a dielectric constant is less than 4.5.

13. The method of claim 11, wherein oxidizing the conformal silicon carbonitride (SiCN) film comprises exposing the conformal silicon carbonitride (SiCN) film to a third precursor, the third precursor comprising one or more of water ($H_2O$) and hydrogen peroxide ($H_2O_2$), or an organic oxidizing agent.

14. The method of claim 11, wherein oxidizing the conformal silicon carbonitride (SiCN) film comprises exposing the conformal silicon carbonitride (SiCN) film to an oxidizing environment of water ($H_2O$) and oxygen ($O_2$).

15. The method of claim 11, wherein thermally annealing treating the conformal silicon oxycarbonitride (SiOCN) film with one or more of oxygen ($O_2$), ozone ($O_3$), and an inert gas at a temperature greater than 200° C.

16. The method of claim 11, wherein the first deposition cycle is repeated n number of times, wherein n is an integer in a range of from 1 to 1000.

17. The method of claim 11, wherein the first deposition cycle, the oxidizing, and the thermally annealing form a first super cycle that is repeated m number of times, wherein m is an integer in a range of from 1 to 1000.

18. The method of claim 11, wherein the first deposition cycle and the oxidizing form a second super cycle that is repeated p number of times, wherein p is an integer in a range of from 1 to 1000.

19. The method of claim 11, wherein the first deposition cycle is performed at a temperature in a range of from 200° C. to 550° C.

20. The method of claim 11, wherein the first purge gas and the second purge gas are independently selected from argon (Ar), helium (He), and nitrogen ($N_2$).

* * * * *